(12) United States Patent
Son et al.

(10) Patent No.: US 7,102,950 B2
(45) Date of Patent: Sep. 5, 2006

(54) FUSE DATA STORAGE SYSTEM USING CORE MEMORY

(75) Inventors: Jinshu Son, Saratoga, CA (US); Liqi Wang, Mountain View, CA (US); Minh V. Le, Richmond, CA (US); Philip S. Ng, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/910,038

(22) Filed: Aug. 2, 2004

(65) Prior Publication Data

US 2006/0023549 A1 Feb. 2, 2006

(51) Int. Cl.
*G11C 7/00* (2006.01)
(52) U.S. Cl. ............................. 365/225.7; 365/189.04
(58) Field of Classification Search ............... None
See application file for complete search history.

(56) References Cited

U.S. PATENT DOCUMENTS

| | | | | |
|---|---|---|---|---|
| 5,488,711 A * | 1/1996 | Hewitt et al. | ............ | 365/238.5 |
| 5,965,997 A * | 10/1999 | Alwardi et al. | ............ | 320/132 |
| 5,995,413 A | 11/1999 | Holzmann et al. | ..... | 365/185.09 |
| 6,469,949 B1 | 10/2002 | Hsu et al. | ................ | 365/225.7 |
| 6,861,868 B1 * | 3/2005 | Agrawal et al. | ............... | 326/38 |

OTHER PUBLICATIONS

Printout: Atmel Interfacing 24CXX Serial EEPROMs, Application Note, "Interfacing AT24CXX Serial EEPROMs with AT89CX051 Microcontrollers", May 2001, 3 pages.

* cited by examiner

*Primary Examiner*—Thong Q. Le
(74) *Attorney, Agent, or Firm*—Schneck & Schneck; Thomas Schneck

(57) ABSTRACT

Fuse data used to configure ancillary circuits used with a non-volatile serial memory core are stored in locations within the memory core. As a first opcode or word is sent on a serial bus to the memory, a logic circuit intercepts the word and generates read fuse enable pulses that fetch the fuse data and configure the ancillary circuits before the last bit of the first command byte arrives. If a read operation is designated, the memory circuits are configured to read. If a write operation is designated, further fuse data is fetched from the memory core to configure ancillary circuits for writing. The fuse data is written to the memory core at the time of circuit manufacture thereby obviating the need for separate storage locations.

36 Claims, 3 Drawing Sheets

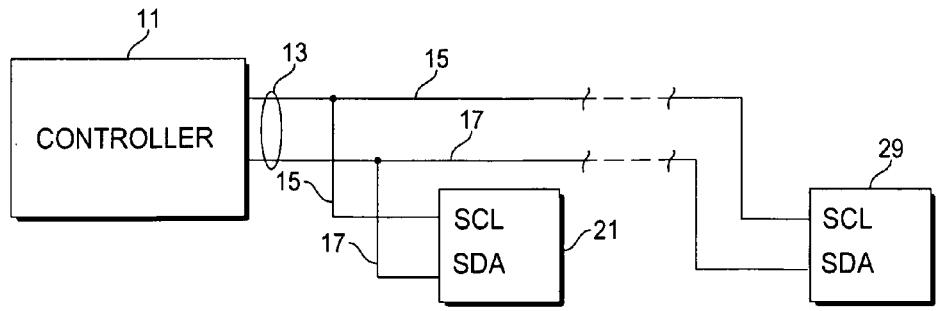
Fig._1 (Prior Art)
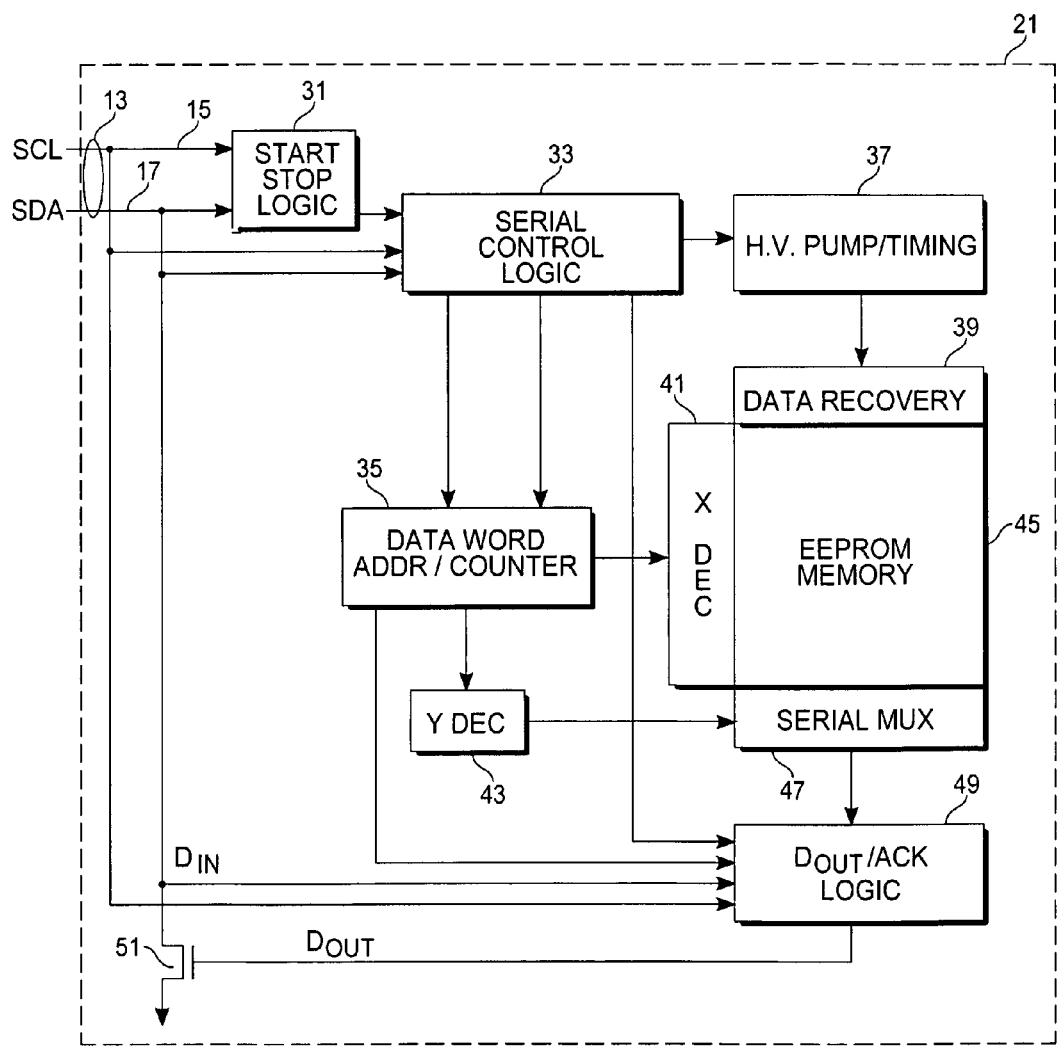
Fig._2 (Prior Art)

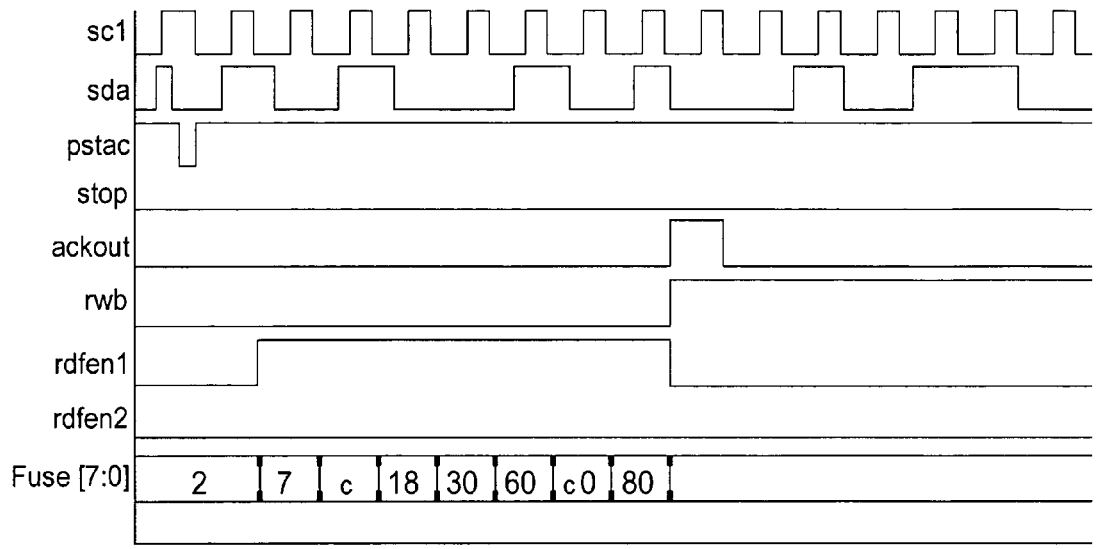
Fig._4
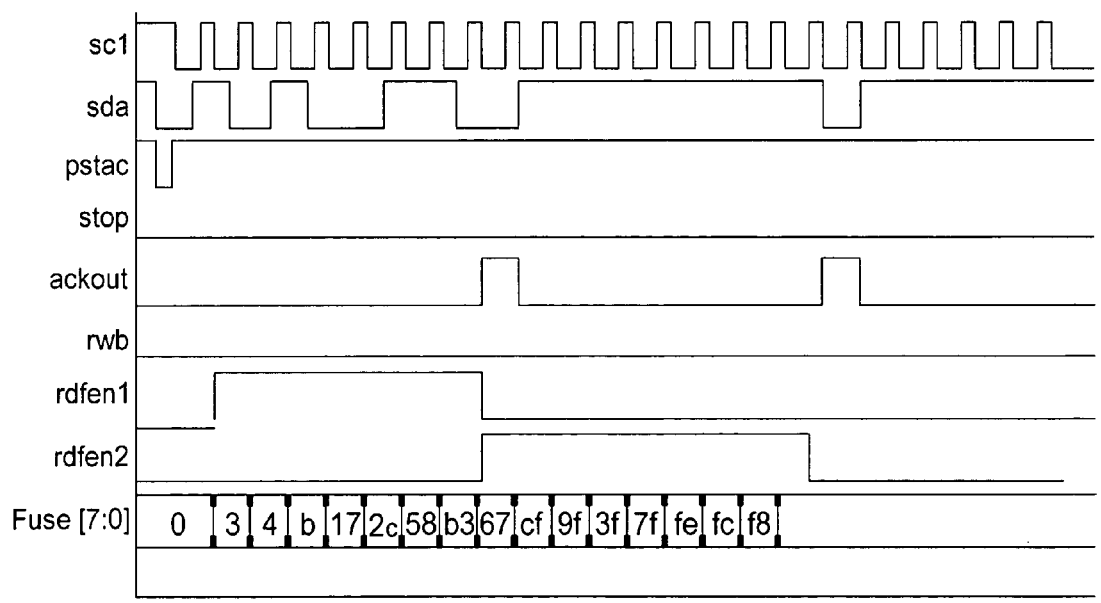
Fig._5

FUSE DATA STORAGE SYSTEM USING CORE MEMORY

TECHNICAL FIELD

The invention pertains to semiconductor non-volatile memories known as serial memories, and more particularly, to a system for storing configuration data bits, known as fuse data, for such memories.

BACKGROUND ART

A serial memory is a memory that is accessed by a bit stream over a bus having a small number of wires, typically two, one for data and one for a clock or synchronizing signal. Oftentimes, it is advantageous to be able to fine tune the serial memory. Typically, non-volatile bits are used to accomplish fine tuning of a serial memory. In the past, such non-volatile bits were stored by fuses and became known as "fuse bits". Today these bits are frequently retained in non-volatile memory cells. Use of fuse bits provides an easy and efficient way to make adjustments to a serial memory.

Fuse bits are configuration data for ancillary semiconductor memory support circuits particularly for serial memories, allowing control or change of configuration of the ancillary circuits for read or write operations. For example, fuse bits can specify reference voltages for sense amplifiers or voltages for charge pumps or pulse duration for controlling charge pump switches. In the prior art, fuse bits were stored outside of main memory.

With reference to FIG. 1, a known micro-controller 11, such as Atmel Corporation's AT89CX051 is connected by a 2-wire bus 13 to a plurality of non-volatile memory devices, such as the serial memories 21 . . . 29. In the protocol described below and in this application, up to 8 serial memories may be connected to bus 13. The number of serial memories could be expanded with certain modifications of the addressing system. A typical serial memory is one of Atmel Corporation's AT24CXX series of devices.

A bidirectional data transfer protocol is utilized by AT24CXX devices of the prior art, allowing a number of compatible devices to share a common 2-wire bus. The bus consists of a serial clock (SCL) line 15 and a serial data (SDA) line 17. The clock is generated by the controller 11, acting as the bus master, and transmitted on line 15 while data is transmitted serially on the data line 17, most significant bit first, synchronized to the clock signal. The protocol supports bidirectional data transfers in 8-bit bytes, although other bit-widths are possible with other memory devices.

The bus master 11 initiates a data transfer by generating a start condition on the bus. This is followed by transmission of a command byte containing the device address of the intended recipient, one of the memory devices 21 . . . 29. The command byte consists of a 4-bit fixed portion and a 3-bit programmable portion that is the device address. The fixed portion must match the value hard-wired into the slave, while the programmable portion allows the master to select between a maximum of eight slaves of similar type on the bus. The memory devices 21 . . . 29, such as AT24CXX serial EEPROMs, receive the command byte with a fixed portion equal to '1010' and a programmable portion matching the address inputs (A0, A1, A2).

The eighth bit in the command byte specifies a write or read operation. After the eighth bit is transmitted, the master 11 releases the data line and generates a ninth clock. If a slave of one of the memory devices 21 . . . 29 has recognized the transmitted device address, it will respond to the ninth clock by generating an acknowledge condition on the data line. A slave which is busy when addressed may not generate an acknowledge. This is true for the AT24CXX when a write operation is in progress.

Following receipt of the slave's address acknowledgment, the master 11 continues with the data transfer. If a write operation has been ordered, the master 11 transmits the remaining data, with the slave acknowledging receipt of each byte. If the master has ordered a read operation, it releases the data line and clocks in data sent by the slave. After each byte is received, the master 11 generates an acknowledge condition on the bus 13. The acknowledge is omitted following receipt of the last byte. The master terminates all operations by generating a stop condition on the bus 13. The master 11 may also abort a data transfer at any time by generating a stop condition.

With reference to FIG. 2, data bus 13 is seen connected to memory device 21 serially communicating with a controller, not shown. The two wires which comprise the data bus 13 are the serial clock line 15 and the serial data line 17, both seen connected to start-stop logic 31, serial control logic 33 and output logic 49. The start-stop logic block 31, in combination with the serial control logic 33, recognizes the device address of memory device 21, thereby initiating the preparation of the ancillary circuits necessary to support a memory read or write operation. These ancillary circuits include a high-voltage pump and timing circuit 37, a data word address counter 35, and data recovery circuit 39. Preparation of the circuits includes supplying chip enable signals, reference or power supply voltage levels, address loading or incrementing signals, etc. The X-decoder 41 and Y-decoder 43, as well as serial multiplexer 47 and output logic 49 and output driver 51, are also prepared for reading or writing a memory word from the memory core 45. The various data bits that enable these ancillary circuits are the fuse bits described in this application. It is seen from FIG. 2 that the enabling and configuring fuse bits are stored outside of the memory core 45, namely in the logic circuits 31 and 33, or alternatively in registers elsewhere in a memory device. It is the storage of fuse bits that the present application addresses.

An object of the invention was to reduce circuitry in a serial memory device, while at the same time not yielding speed or accuracy of the device.

SUMMARY OF INVENTION

The above objects have been achieved in a semiconductor non-volatile serial memory that stores fuse data in the memory core. This would seem improbable in the prior art since it would seem that any data from memory could not be used until read circuitry is set up. However, in the present invention, a specially generated pulse fetches the initialization data for read operation from the memory core simultaneously with input of the first command byte on a serial data bus. By the time the first command byte is completely received, initialization of read circuitry outside of the memory is complete. The first command byte specifies a read or write operation. If a read operation is specified, the read circuitry has just been set up and memory core data words can be read. If a write operation is specified, the next command byte, which is address byte, will be sent to the non-volatile serial memory. Simultaneously with the input of the next command byte, the specially generated pulse fetches initialization data for write operation from the memory core. In each case, a read related fuse byte or a write related fuse byte is fetched from the memory core and read into registers that operate read and write control circuits outside of the memory. All of this is done on-the-fly while opcodes for read or write operations are being received in a serial bit stream. The first bit in a command byte after a start pulse launches the specially generated pulses so that read circuitry can be set up by the time the last bit in the first command byte arrives on the data bus.

By storing fuse bits in the memory core, storage of fuse data is simplified and storage circuitry is reduced.

BRIEF DESCRIPTION OF THE DRAWINGS

FIG. 1 is an electrical block diagram of a plurality of serial memories connected as slaves under control of a master controller unit by means of a serial bus in accordance with the prior art.

FIG. 2 is an electrical block diagram of one of the serial memories, shown in FIG. 1.

FIGS. 4 and 5 are timing diagrams for read and write operations, respectively, some generated by a master controller, as in FIG. 1, for use with a serial memory as shown in FIG. 3.

BEST MODE FOR CARRYING OUT THE INVENTION

Figure 3:
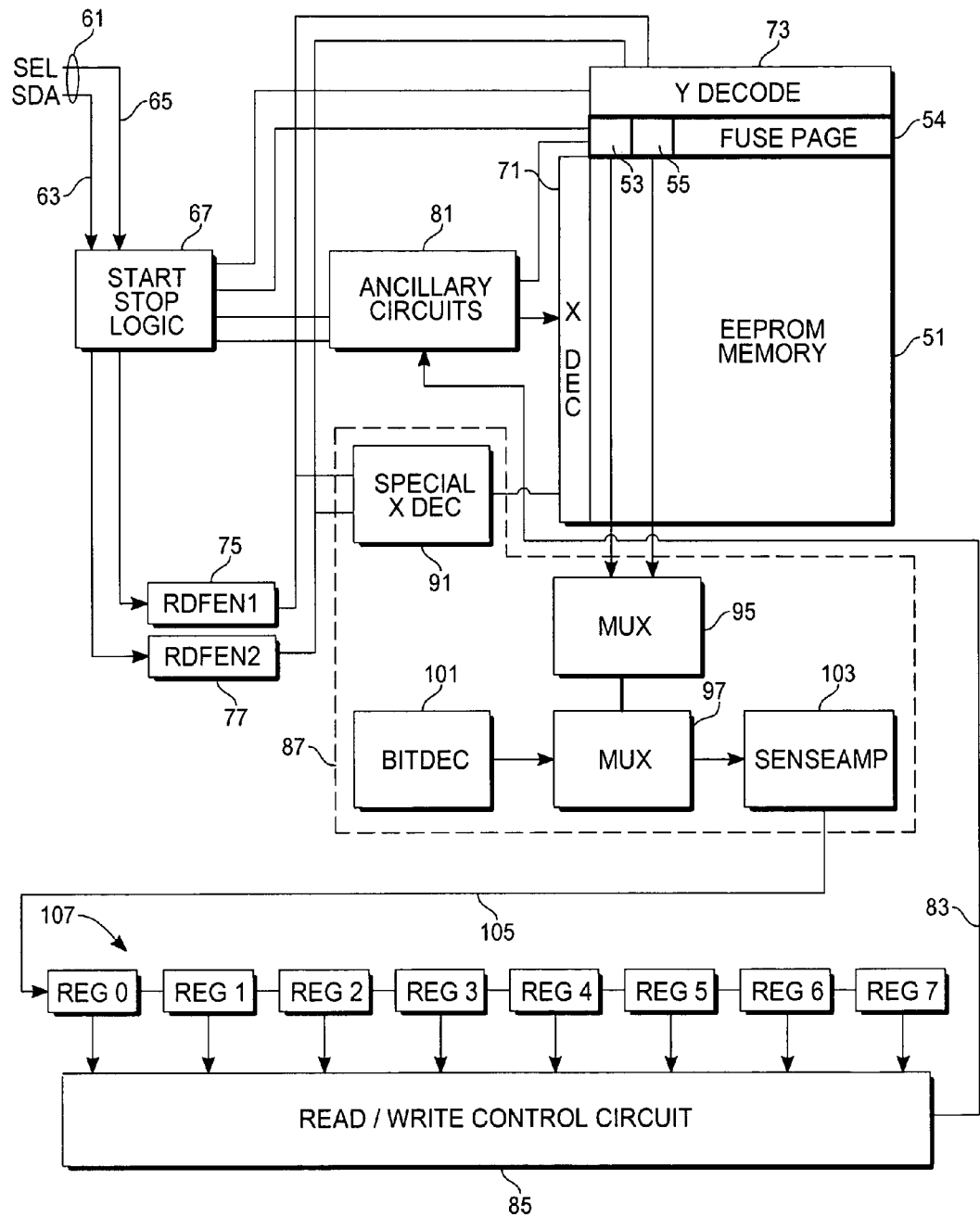
FIG. 3 is an electrical block diagram of a serial memory in accordance with the present invention.

With reference to FIG. 3, memory core 51 is an X-Y array of memory cells, preferably CMOS EEPROM memory cells arranged in rows and columns in the usual way. For convenience, rows may be organized as pages of logical memory. In a first byte, shown as byte 53 of fuse page 54, read related fuse data is stored. In a second byte, shown as byte 55 of fuse page 54, write related fuse data is stored. In both bytes, the stored data is organized as 8-bit words so that a single memory address corresponds to an 8-bit word.

A controller, not shown in FIG. 3, communicates with memory core 51 on serial data bus 61 having a serial clock line 65 and serial data line 63. Both lines feed logic block 67 that shapes data using the transmitted clock signal and forwards data to memory core 51 using X, Y address logic 71, 73, respectively.

When bits of a new command first arrive at logic block 67, first and second read fuse enable signals are generated, represented by blocks 75 and 77, respectively. This is done automatically and without intervention. These signals are generated immediately upon the arrival of a new command in order to fetch fuse data from memory to alert ancillary circuits 81 that are needed for reading and writing data from and into memory core 51. The signals must act simultaneously with, or before, the arrival of the first command byte so that the first data word from the memory core can be read.

The ancillary circuits 81 may be a charge pump, voltage generators for supplying needed voltages, timing circuits, switches and configuration generating logic. The data stream for the ancillary circuits is fed to ancillary circuits 81 on line 83 from read-write control circuit 85. In turn the read-write control circuit 85 is fed by a circuit means 87 which has a dedicated X decoder 91, multiplexers 95 and 97, bit decoder 101, sense amplifier 103 and output line 105. The output line 105 feeds register bank 107 having 8 registers Reg 0, Reg 1 . . . Reg 7. In turn, the register bank 107 feeds read-write control circuit 85.

Returning to the read fuse enable signals represented by blocks 75 and 77, termed RDFEN1 and RDFEN2 (for read fuse enable signal one and two), one should note that they directly access memory core 51 through address circuitry, namely the dedicated X decoder 91 and the usual Y decoder 73. The X decoder 91 is not the normal X decoder, but a dedicated circuit that directly accesses the read related fuse byte 53 and the write related fuse byte 55, both in memory core 51 specified by a Y address in Y decoder 73. This fuse data is organized in 8 bit words. Multiplexer 95, connected to Y decoder block 73 identifies which of the bytes 53 and 55 is being accessed. The X decoder 91 accesses the required 8 bits that are fed to a serializing multiplexer 97 that is assisted by a bit decoder 101, giving shape to the bits, and a sense amplifier 103 whereby an 8 bit serial stream is fed to the register bank 107 before loading into read-write control circuit 85.

While the logic block 67 is receiving an initial command, the configuration activity established by RDFEN1 and RDFEN2 is under way. By the time the configuration activity is complete, the initial word has just been received and the ancillary circuits 81 have received configuration information from the read/write control circuit 85 on line 83.

In the 2-wire serial EEPROM protocol of the prior art, described with reference to FIG. 1, there is an 8-bit start byte (opcode) from controller 11 onto bus 13 or bus 65 of FIG. 3. The first four bits are fixed (1010) and the next three bits are programmed to specify one of up to eight memories. The last bit specifies a read or write operation (write=0; read=1).

When the first opcode byte of a read or write command is input into a 2-wire serial bus 65, the fuse bytes 53, 55 of memory core 51 are accessed when generated pules RDFEN1 in block 75, for read fuse enable one, enables reading of the first fuse byte for controlling memory read circuitry 85. This first fuse byte must direct set up of ancillary circuits 81 for reading main memory before by next opcode. By the time the last bit of the first opcode byte is input into the chip, and a read operation is called by the last bit of the first opcode byte, the chip is ready for read operation. Ancillary circuits 81 for reading main memory are already set up and controlled by the first fuse byte.

If a write operation is called by the last bit of the first fuse byte, one or more further opcodes are read to specify a write address. In this situation, the fuse byte 55 of the memory is accessed when generated pulse RDFEN2, in block 77 for read fuse enable two, enables reading of the second fuse byte for controlling memory write circuitry 85 during the opcode time for the first byte of write address. This second fuse byte directs set up of ancillary circuitry 81 for obtaining addresses for writing to the memory core 51, but there is not the urgency to obtain the fuse data as during the first byte of address opcode time because the whole write opcode time (including start byte opcode, write address bytes and write data bytes) is longer compared to the read operation.

The register bank 107, having eight one-bit registers are provided to control read/write control circuits 85. In the above protocol, the registers are used during a read command for read fuse bits extracted from the fuse byte 53 of the memory core 51. The same registers are used during a write command for write fuse bits extracted from the fuse byte 55 of the memory core 51, the write fuse bits occurring at a different time, namely during the second byte of the opcode and overwriting the read fuse bits.

If the input command is a read command, the read fuse byte will be stored in the registers during the first byte opcode time and the output of the registers will control or change the memory support circuitry for read operation. If the input command is a write command, the write fuse byte will be stored in the registers during the second byte opcode time, the previously stored read fuse byte data in the registers will be overwritten, and the output of the registers will control or change the memory support circuitry for write operation.

With reference to FIG. 4, timing pulses for a read operation are shown. Note the 8 data bits per word. The top two plots show bus signals on lines SCL 65 and SDA 63 in FIG. 3. The next two timing pulses PSTAC and STOP are related to start and stop of communication. The next timing pulse, ACKOUT is a response from logic circuit 67 once 8 data bits are received. In FIG. 4, the 8 data bits are seen to be 10100101, with the last one (1) indicating a read operation. The next pulse, RWB, is read write bar, meaning an active high read is one and an active low write is zero, i.e. a read-write signal. The next two pulses RDFEN1 and RDFEN2 are represented in blocks 75 and 77. Note that RDFEN2 stays low after the first data word.

For a read operation the RDFEN pulses have the following polarities during the first and second opcodes.

|        | Read Word 1<br>Get READ Fuse Byte | Read Word 2<br>Continue READ |
|--------|-----------------------------------|------------------------------|
| RDFEN1 | HIGH                              | LOW                          |
| RDFEN2 | LOW                               | LOW                          |

FIG. 5 shows the same timing pulses for a write operation during the first and second opcodes.

|        | Read Word 1<br>Get READ Fuse Byte | Read Word 2<br>Get WRITE Fuse Byte |
|--------|-----------------------------------|------------------------------------|
| RDFEN1 | HIGH                              | LOW                                |
| RDFEN2 | LOW                               | HIGH                               |

Note that in the case of FIG. 4 the fuse data during the lowermost pulse train is present only during the first opcode byte. This is because the read configuration must be accomplished by the time that the first opcode byte is received. The early RDFEN pulses allow this to be done.

In the case of FIG. 5 the fuse data during the lowermost pulse train continues after the first opcode byte. The subsequent opcode byte gives an address for writing with further fuse data for write circuit configuration.

Configuration data, or fuse bytes are easily loaded in the memory core at the time of manufacture. The storage locations are logical pages of the memory core not accessible to a user except as described above.

The invention claimed is:

1. A fuse data storage system comprising:
a non-volatile serial memory having a memory core with read related fuse data for configuring ancillary circuits, the read related fuse data stored in a first addressable location and write related fuse data for configuring ancillary circuits, the write related fuse data stored in a second addressable location;
a data bus for carrying a serial data stream to the serial memory, the data stream having a succession of data words including a first data words;
logic connected to the data bus, the logic for generating fuse enable signals accessing at least the first location in the core containing read related fuse data;
a circuit for receiving the read related fuse data and for configuring read control circuits and outputting configuration data; and
ancillary circuits responsive to the configuration data and connected to the logic and to the memory core, the ancillary circuits having means for operating the memory core in data reading and writing operations.

2. The system of claim 1 wherein said memory is divided into bytes and said first addressable location is a first memory byte.

3. The system of claim 2 wherein said second addressable location is a second memory byte distinct from the first memory byte.

4. The system of claim 1 wherein said data bus comprises two wires, including a clock wire and a data wire.

5. The system of claim 1 wherein the fuse enable signals comprise first and second enable signals on first and second fuse enable wire lines.

6. The system of claim 5 wherein the first and second wire lines are both connected to X and Y decoders for accessing the first and second locations in the memory.

7. The system of claim 6 wherein each location accessed in the memory contains a control data word.

8. The system of claim 7 further comprising multiplexer means for serializing the control data word.

9. The system of claim 5 wherein the first and second fuse enable signals specify a read operation before a write operation.

10. The system of claim 1 wherein said first data word has a last bit that specifies a read or write operation, the ancillary circuits being responsive to the configuration data before the last bit is read.

11. A fuse data storage system including a controller comprising:
a non-volatile memory core having rows and columns of data storage locations, some of the storage locations having fuse data for configuring ancillary circuits therein;
a plurality of ancillary circuits associated with the memory core that are configured by the fuse data;
a data bus for carrying serial data from the controller;
logic means associated with the data bus for receiving and reading data words from the controller and for generating fuse enable signals in response to the start of a first data word; and
circuit means connected to the logic means, the circuit means for receiving the fuse enable signals and for accessing the fuse data, the circuit means connected to the ancillary circuits in a fuse data communication relation, the ancillary circuits receiving the fuse data simultaneously with reading the first data word.

12. The system of claim 11 wherein the data bus is a two wire bus comprising a data line and a clock line.

13. The system of claim 11 wherein the memory core is divided into bytes with dedicated bytes containing the fuse data.

14. The system of claim 11 wherein read related fuse data is in a first memory location and write related fuse data is in a second memory location.

15. The system of claim 14 wherein the fuse enable signals comprise a first fuse enable signal directed to access the first memory location.

16. The system of claim 14 wherein the fuse enable signals comprise first and second fuse enable signals directed to access the first and second memory locations.

17. A method for configuring ancillary circuits associated with a serial non-volatile memory of the type communicating with a controller by a data bus comprising:

addressing the serial non-volatile memory with a first data word transmitted from the controller on the data bus through a logic circuit;

storing fuse data for configuring ancillary circuits at locations in a core of the serial non-volatile memory;

directly accessing the fuse data simultaneously with the addressing of the serial memory through the logic circuit with the first data word; and using the fuse data to configure the ancillary circuits as the first data word is received by the logic circuit.

18. The method of claim 17 further defined by storing fuse data at locations in the serial memory at the time of memory manufacturing.

19. The method of claim 17 wherein the serial memory has an array of rows and columns, the storing of the fuse data being in selected rows or columns.

20. The method of claim 17 wherein said step of directly accessing the fuse data is carried out by generating fuse data pulses at the start of the first data word.

21. The method of claim 20 wherein said generating of fuse data pulses is by placing pulses on two lines read simultaneously.

22. Fuse data control system for configuring a serial non-volatile memory comprising:

a serial non-volatile memory means for storing read and write related fuse data words for configuring ancillary circuits;

input means associated with the memory means for accessing a read-related fuse data word simultaneously with the arrival of data bits of the fist input data word;

output means associated with the memory means for loading the accessed read related fuse data word in a register bank;

a read-write control circuit means connected to the register bank for generating configuration bits; and ancillary circuit means connected to the read-write control circuit means, the ancillary circuit means for responding to the configuration bits by readying ancillary circuits for read or write operations, the input means accessing the write related fuse data word simultaneously with the arrival of a second input data word, the output means loading the accessed write related fuse data words in the same register bank, overwriting the read related fuse data word with further configuration bits generated by the read-write control circuit means.

23. The system of claim 22 having logical pages in rows of the memory wherein said fuse data is stored.

24. The system of claim 22 wherein said input means comprises a serial data bus.

25. The system of claim 22 wherein said output means comprises a word-wide transfer means for fuse data words.

26. The system of claim 25 comprising means connected to the output means for serializing words in the transfer means into a bit stream.

27. The system of claim 26 wherein said register bank comprises a plurality of shift registers having said bit stream as an input.

28. The system of claim 22 wherein said control circuit means has means for responding to said shift registers one configuration bit at a time.

29. A method of configuring a non-volatile serial memory having configurable ancillary circuits comprising:

storing configuration data in a memory core of a serial non-volatile memory, as a first multi-bit data word is transmitted toward the memory, fetching the configuration data from the memory core, and configuring the ancillary circuits with the configuration data as the first multi-bit word is transmitted toward the memory, whereby the memory is ready for reading.

30. The method of claim 29 further defined by separately storing read related and write related configuration data.

31. The method of claim 30 further defined by fetching configuration words from the memory and serializing the configuration words for use by the ancillary circuits.

32. The method of claim 31 further defined by registering the serialized configuration data prior to use by the ancillary circuits.

33. The method of claim 32 further defined by first registering read related configuration data and then overwriting the registered read related configuration data with subsequent configuration data.

34. A fuse data storage system comprising:

a non-volatile serial memory having a memory core with read related fuse data for configuring ancillary circuits, the read related fuse data stored in a first addressable location and write related fuse data for configuring ancillary circuits, the write related fuse data stored in a second addressable location;

a data bus for carrying a serial data stream to the serial memory, the data stream having a succession of data words including a first data words;

logic means connected to the data bus, the logic means for generating fuse enable signals accessing at least the first location in the core containing read related fuse data, wherein the fuse enable signals comprise first and second enable signals on first and second fuse enable wire lines;

circuit means for receiving the read related fuse data and for configuring read control circuits and outputting configuration data; and ancillary circuits responsive to the configuration data and connected to the logic means and to the memory core, the ancillary circuits having means for operating the memory core in data reading and writing operations.

35. The system of claim 34 wherein said data bus comprises two wires, including a clock wire and a data wire.

36. The system of claim 34 wherein the first and second fuse enable signals specify a read operation before a write operation.

* * * * *